US006271957B1

(12) United States Patent
Quate et al.

(10) Patent No.: US 6,271,957 B1
(45) Date of Patent: Aug. 7, 2001

(54) METHODS INVOLVING DIRECT WRITE OPTICAL LITHOGRAPHY

(75) Inventors: Calvin F. Quate, Stanford; David Stern, Mountain View, both of CA (US)

(73) Assignee: Affymetrix, Inc., Santa Clara, CA (US)

( * ) Notice: Subject to any disclaimer, the term of this patent is extended or adjusted under 35 U.S.C. 154(b) by 0 days.

(21) Appl. No.: 09/318,775

(22) Filed: May 26, 1999

Related U.S. Application Data (60) Provisional application No. 60/087,333, filed on May 29, 1998.

(51) Int. Cl.[7] .................................................. G02B 26/08
(52) U.S. Cl. .................. 359/298; 359/619; 359/293; 359/223; 204/157.58; 204/456; 422/50; 536/25.3; 436/518
(58) Field of Search ..................... 359/290, 291, 359/292, 293, 298, 223, 619; 204/157.68, 157.61, 456; 422/50; 536/25.3; 436/518

(56) References Cited

U.S. PATENT DOCUMENTS

| 4,163,150 | 7/1979 | Stankewitz ............................. 250/205 |
| 4,662,746 | 5/1987 | Hornbeck ................................ 359/223 |
| 5,143,854 | 9/1992 | Pirrung et al. ......................... 436/518 |
| 5,318,679 | 6/1994 | Nishioka ............................ 204/157.68 |
| 5,384,261 | 1/1995 | Winkler et al. ....................... 436/518 |
| 5,424,186 | 6/1995 | Fodor et al. .............................. 435/6 |
| 5,445,934 | 8/1995 | Fodor et al. .............................. 435/6 |
| 5,510,270 | 4/1996 | Fodor et al. .......................... 436/518 |
| 5,517,280 | 5/1996 | Quate ...................................... 355/71 |
| 5,539,567 | 7/1996 | Lin et al. ................................ 359/281 |
| 5,539,568 | 7/1996 | Lin et al. ................................ 359/285 |
| 5,571,639 | 11/1996 | Hubbell et al. ........................... 430/5 |
| 5,593,839 | 1/1997 | Hubbell et al. ........................... 435/6 |
| 5,653,939 | 8/1997 | Hollis et al. ............................ 422/50 |
| 5,666,190 | 9/1997 | Quate et al. ............................ 355/71 |
| 5,677,195 | 10/1997 | Winkler et al. ....................... 436/518 |
| 5,744,305 | 4/1998 | Fodor et al. .............................. 435/6 |
| 5,768,009 | 6/1998 | Little ...................................... 359/293 |

(List continued on next page.)

FOREIGN PATENT DOCUMENTS

| WO 99/41007 | 8/1999 | (WO) . |
| WO 99/42813 | 8/1999 | (WO) ............................ G01N/21/00 |
| WO 99/63385 | 12/1999 | (WO) . |

OTHER PUBLICATIONS

Fink and Christiansen, Electronics Engineers Handbook, 3rd Ed., McGraw Hill, (1989), pp. 11–96 and 11–99.

Beecher, McGall, and Goldberg: "Chemically Amplified Photolithography for the Fabrication of High Density Oligonucleotide Arrays" Affymetrix, pp. 597 and 598. No date.

(List continued on next page.)

*Primary Examiner*—Loha Ben
(74) *Attorney, Agent, or Firm*—Banner & Witcoff, Ltd.

(57) ABSTRACT

An improved optical photolithography system and method provides predetemined light patterns generated by a direct write system without the use of photomasks. The Direct Write System provides predetermined light patterns projected on the surface of a substrate (e.g., a wafer) by using a computer controlled component for dynamically generating the predetermined light pattern, e.g., a spatial light modulator. Image patterns are store in computer and through electronic control of the spatial light modulator directly illuminate the wafer to define a portion of the polymer array, rather than being defined by a pattern on a photomask. Thus, in the Direct Write System each pixel is illuminated with an optical beam of suitable intensity and the imaging (printing) of an individual feature is determined by computer control of the spatial light modulator at each photolithographic step without the use of a photomask. The Direct Write System including a spatial light modulator is particularly useful in the synthesis of DNA arrays and provides an efficient element for polymer array synthesis by using spatial light modulators to generate a predetermined light pattern that defines the image patterns of a polymer array to be deprotected.

23 Claims, 4 Drawing Sheets

U.S. PATENT DOCUMENTS

| | | | | |
|---|---|---|---|---|
| 5,835,256 | * | 11/1998 | Huibers | 359/291 |
| 5,883,705 | | 5/1999 | Minnie et al. | 355/71 |
| 5,936,759 | * | 8/1999 | Buttner | 359/291 |
| 5,953,153 | * | 9/1999 | Conner et al. | 359/298 |

OTHER PUBLICATIONS

Beecher, McGall, and Goldberg: "The Application of Photolithographic Techniques for the Fabrication of High Density Oligonucleotide Arrays" Affymetrix, 2 pages. No date.

Bertsch, Lorenz, and Renaud: "Combining Microstereolithography and Thick Resist UV Lithography for 3D Microfabrication" Swiss Federal Institute of Technology (EPFL), pp. 18–23. No date.

Wallraff, Labadie, Brock, DiPietro, Nguyen, Huynh, Hinsberg, and McGall: "DNA sequencing on a chip" Chemtech, Feb. 1997, pp. 22–32.

Silicon Light Machines, "The Grating Light Valve Technology," taken from (www.siliconlight.com framespresspressbottom.html), Apr. 27, 1997, page 1.

Silicon Light Machines, "Recent Press Releases, Silicon Light Machines Spearheads Development of Next–Generation Display Technology, Company Addresses Need for Higher Resolution Displays In Emerging Market Applications," taken from (www.siliconlight.com framespresspressbottom.html), Apr. 27, 1997, pp. 1–3.

Paufler, Kuck, Seltmann, Doleschal, Gehner, and Zimmer, "High–throughput optical direct write lithography," Solid State Technology, Jun. 1997, pp. 175–182.

McGall, Labadie, Brock, Wallraff, Nguyen, and Hinsberg, "Light–directed synthesis of high–density oligonucleotide arrays using semiconductor photoresists," Proc. Natl. Acad. Sci., Applied Physical Sciences, vol. 93, Nov. 1996, pp. 13555–13560.

Seltmann, Doleschal, Gehner, Kuck, Melcher, Paufler, and Zimmer, "New System for Fast Submicron Optical Direct Writing," Microelectronic Engineering, 1996, pp. 123–127.

Kuck, Bollerott, Doleschal, Gehner, Grundke, Kunze, Melcher Paufler, Seltmann, and Zimmer, "New system for fast submicron laser direct writing," SPIE, vol. 2440, pp. 506–514.

Smith, Modern Optical Engineering, McGraw Hill, (1990), p. 152.

Yoder, "The State of the Art in Projection Display: An Introduction to the Digital Light Processing (DLP) Technology," Texas Instruments, taken from (www.ti.com/dlp/docs/papers/state.html), Apr. 1997.

Pease, Solas, Sullivan, Cronin, Holmes, and Fodor: "Light–generated oligonucleotide arrays for rapid DNA sequence analysis" Affymetrix, Proc. Natl. Acad. Sci. USA, vol. 91, May 1994, pp. 5022–5026.

Singh–Gasson, Green, Yue, Nelson, Blattner, Sussman, and Cerrina: "Maskless fabrication of light–directed oligonucleotide microarrays using a digital micromirror array", Nature Biotechnology, vol. 17, Oct. 1999, pp. 974–978.

Digital Optical Chemistry, "The Digital Optical Chemistry System", taken from (http://pompous.swmed.edu:80/doc) on Aug. 31, 1999, pp. 1–8.

WIPO, publication no. WO 99/63385 of PCT/US99/12523 entitled "Digital Optical Chemistry Micromirror Imager" Dec. 9, 1999.

European Search Report dated Dec. 1, 2000 corresponding to application no. 99110362.3–1213.

Davidson, Mark, "A Microlens Direct–Write Concept for Lithography" SPIE vol. 3048, pp. 346–355, 1997.

Monk, David W. et al, "The Digital Micromirror Device for Projection Display" Microelectronic Engineering 27 (1995) pp. 489–493.

WIPO, publication no. WO 97/26569 of PCT/US97/00854 entitled "Method and Apparatus for Using an Array of Grating Light Valves to Produce Multicolor Optical Images".

WIPO, publication no. WO 00/13017 of PCT/EP99/06316 entitled "Method and Device for Producing and/or Analyzing Biochemical Reaction Supporting Materials".

WIPO, publication no. WO 00/47598 of PCT/KR00/00100 entitled "Method and Apparatus for Compound Library Preparation Using Optical Modulator".

* cited by examiner

METHODS INVOLVING DIRECT WRITE OPTICAL LITHOGRAPHY

This application relates to provisional application Ser. No. 60/087,333 filed May 29, 1998 which is hereby incorporated by reference in its entirety.

BACKGROUND OF THE INVENTION

1. Technical Field of the Invention

This invention relates to optical lithography and more particularly to direct write optical lithography.

2. Description of the Related Art

Polymer arrays, such as the GeneChip® probe array (Affymetrix, Inc., Santa Clara, Calif.), can be synthesized using light-directed methods described, for example, in U.S. Pat. Nos. 5,143,854; 5,424,186; 5,510,270; 5,800,992; 5,445,934; 5,744,305; 5,384,261 and 5,677,195 and PCT published application no. WO 95/11995, which are hereby incorporated by reference in their entireties. As an example, light-directed synthesis of oligonucleotides employs 5'-protected nucleosidephosphoramidite "building blocks." The 5'-protecting groups may be either photolabile or acid-labile. A plurality of polymer sequences in predefined regions are synthesized by repeated cycles of deprotection (selective removal of the protective group) and coupling. Coupling (i.e., nucleotide or monomer addition) occurs only at sites that have been deprotected. Three methods of light-directed synthesis are: use of photolabile protecting groups and direct photodeprotection (DPD); use of acid-labile 4,4'-dimethoxytrityl (DMT) protecting groups and a photoresist; use of DMT protecting groups and a polymer film that contains a photoacid generator (PAG).

These methods have many process steps similar to those used in semiconductor integrated circuit manufacturing. These methods also often involve the use of photomasks (masks) that have a predefined image pattern which permits the light used for synthesis of the polymer arrays to reach certain regions of a substrate but not others. The substrate can be non-porous, rigid, semi-rigid,etc. It can be formed into a well, a trench, a flat surface, etc. The substrate can include solids, such as siliceous substances such as silicon, glass, fused silica, quartz, and other solids such as plastics and polymers, such as polyacrylamide, polystyrene, polycarbonate, etc. Typically, the solid substrate is called a wafer from which individual chips are made (See the U.S. patents above which are incorporated herein by reference). As such, the pattern formed on the mask is projected onto the wafer to define which portions of the wafer are to be deprotected and which regions remain protected. See, for example, U.S. Pat. Nos. 5,593,839 and 5,571,639 which are hereby incorporated by reference in their entireties.

The lithographic or photochemical steps in the synthesis of nucleic acid arrays may be performed by contact printing or proximity printing using photomasks. For example, an emulsion or chrome-on-glass mask is placed in contact with the wafer, or nearly in contact with the wafer, and the wafer is illuminated through the mask by light having an appropriate wavelength. However, masks can be costly to make and use and are capable of being damaged or lost.

In many cases a different mask having a particular predetermined image pattern is used for each separate photomasking step, and synthesis of a wafer containing many chips requires a plurality of photomasking steps with different image patterns. For example, synthesis of an array of 20mers typically requires approximately seventy photolithographic steps and related unique photomasks. So, using present photolithographic systems and methods, a plurality of different image pattern masks must be pre-generated and changed in the photolithographic system at each photomasking step. This plurality of different pattern masks adds lead time to the process and complexity and inefficiency to the photolithographic system and method. Further, contact printing using a mask can cause defects on the wafer so that some of the reaction sites are rendered defective. Thus, aphotolithographic system and method that does not require such masks and obviates such difficulties would be generally useful in providing a more efficient and simplified lithographic process.

SUMMARY OF THE INVENTION

In view of the above, one advantage of the invention is providing an improved and simplified system and method for optical lithography.

Another advantage of the present invention is providing an optical lithography system and method that dynamically generates an image using a computer and reconfigurable light modulator.

A further advantage of the present invention is providing an optical lithography system and method that does not use photomasks.

A still further advantage of the present invention is providing an optical lithography system and method that uses computer generated electronic control signals and a spatial light modulator, without any photomask, to project a predetermined light pattern onto a surface of a substrate for the purposes of deprotecting various areas of a polymer array.

According to one aspect of the invention, polymer array synthesis is performed using a system without photomasks.

According to a second aspect of the invention, polymer array synthesis is performed using a system with a transmissive spatial light modulator and without a lens and photomask.

According to another aspect of the invention, a Direct Write System transmits image patterns to be formed on the surface of a substrate (e.g., a wafer). The image patterns are stored in a computer. The Direct Write System projects light patterns generated from the image patterns onto a surface of the substrate for light-directed polymer synthesis (e.g., oligonucleotide). The light patterns are generated by a spatial light modulator controlled by a computer, rather than being defined by a pattern on a photomask. Thus, in the Direct Write System each pixel is illuminated with an optical beam of suitable intensity and the imaging (printing) of an individual feature on a substrate is determined dynamically by computer control.

According to a further aspect of the invention, polymer array synthesis is accomplished using a class of devices known as spatial light modulators to define the image pattern of the polymer array to be deprotected.

An even further aspect of the present invention provides methods for synthesizing polymer arrays using spatial light modulators and the polymer arrays synthesized using the methods taught herein.

As can be appreciated by one skilled in the art, the invention is relevant to optical lithography in general, and more specifically to optical lithography for polymer array synthesis using photolithograpic processes. However, it is inherent that the invention is generally applicable to eliminating the need for a photomask in optical lithography.

BRIEF DESCRIPTION OF THE DRAWINGS

The above objects, features, and advantages of the present invention will become more apparent from the following detailed description taken with the accompanying drawings in which.

DESCRIPTION OF THE PREFERRED EMBODIMENTS

The present invention refers to articles and patents that contain useful supplementary information. These references are hereby incorporated by reference in their entireties.

The presently preferred invention is based on the principle that a Direct Write Optical Lithography System will significantly improve the cost, quality, and efficiency of polymer array synthesis by providing a maskless optical lithography system and method where predetermined image patterns can be dynamically changed during photolithographic processing. As such, an optical lithography system is provided to include a means for dynamically changing an intended image pattern without using a photomask. One such means includes a spatial light modulator that is electronically controlled by a computer to generate unique predetermined image patterns at each photolithograpic step in polymer array synthesis. The spatial light modulators can be, for example, micromachined mechanical modulators or microelectronic devices (e.g. liquid crystal display (LCD)). The Direct Write System of the present invention using such spatial light modulators is particularly useful in the synthesis of polymer arrays, such as polypeptide, carbohydrate, and nucleic acid arrays. Nucleic acid arrays typically include polynucleotides or oligonucleotides attached to glass, for example, Deoxyribonucleic Acid (DNA) arrays.

Certain preferred embodiments of the invention involve use of the micromachined mechanical modulators to direct the light to predetermined regions (i.e., known areas on a substrate predefined prior to photolithography processing) of the substrate on which the polymers are being synthesized. The predetermined regions of the substrate associated with, for example, one segment (referred to herein as a pixel) of a micromachined mechanical modulator (e.g., a micro-mirror array) are referred to herein as features. In each predetermined region or feature a particular oligonucleotide sequence, for example, is synthesized. The mechanical modulators come in a variety of types, two of which will be discussed in some detail below.

One type of mechanical modulator is a micro-mirror array which uses small metal mirrors to selectively reflect a light beam to particular individual features; thus causing the individual features to selectively receive light from a light source (i.e., turning light on and off of the individual features). An example is the programmable micro-mirror array Digital Micromirror Device (DMD™) manufactured by Texas Instruments, Inc., Dallas, Tex., USA. Texas Instruments markets the arrays primarily for projection display applications (e.g., big-screen video) in which a highly magnified image of the array is projected onto a wall or screen. The present invention shows, however, that with appropriate optics and an appropriate light source, a programmable micro-mirror array can be used for photolithographic synthesis, and in particular for polymer array synthesis.

The Texas Instruments' DMD™ array consists of 640× 480 mirrors (the VGA version) or 800×600 mirrors (the super VGA (SVGA) version). Devices with more mirrors are under development. Each mirror is 16 $\mu$m×16 $\mu$m and there are 1-$\mu$m gaps between mirrors. The array is designed to be illuminated 20 degrees off axis. Each mirror can be turned on (tilted 10 degrees in one direction) or off (tilted 10 degrees in the other direction). A lens (on axis) images the array onto a target. When a micro-mirror is turned on, light reflected by the micro-mirror passes through the lens and the image of the micro-mirror appears bright. When a micro-mirror is turned off, light reflected by the micro-mirror misses the lens and the image of the micro-mirror appears dark. The array can be reconfigured by software (i.e., every micro-mirror in the array can be turned on or off as desired) in a fraction of a second.

Figure 1:
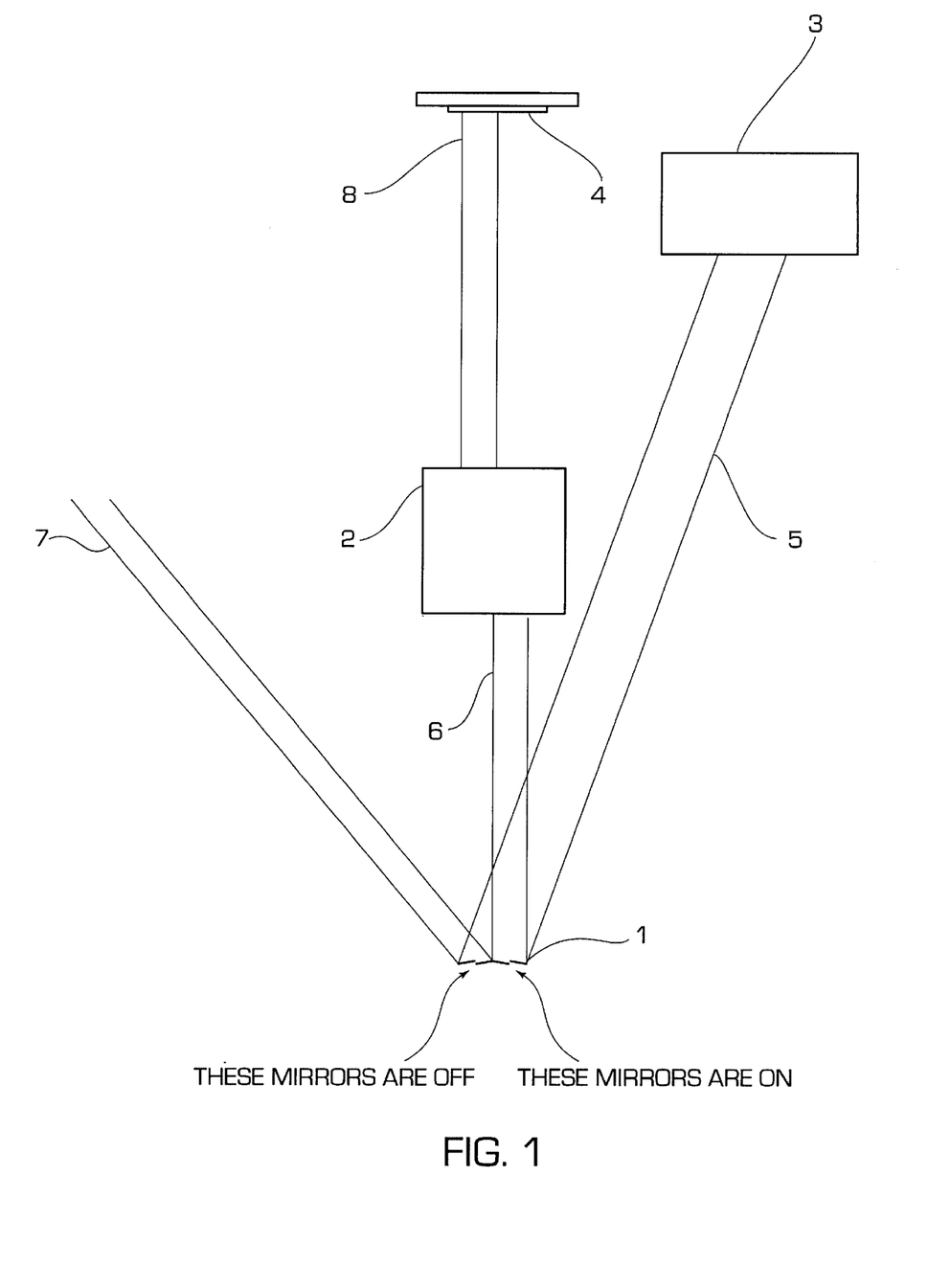
FIG. 1 shows a first embodiment of the invention having a light source, a reflective spatial light modulator, such as a micro-mirror array, and a lens.

An optical lithography system including a micro-mirror array 1 based spatial light modulator according to one embodiment of the invention is shown in FIG. 1. This embodiment includes a spatial light modulator made of a micro-mirror array 1, and arc lamp 3, and a lens 2 to project a predetermined image pattern on a chip or wafer (containing many chips) 4. In operation, collimated, filtered and homogenized light 5 from the arc lamp 3 is selectively reflected as a light beam 6 according to dynamically turned on micro mirrors in the micro-mirror array 1 and transmitted through lens 2 on to chip or wafer 4 as reflected light beam 8. Reflected light from micro-mirrors that are turned off 7 is reflected in a direction away from the lens 2 so that these areas appear dark to the lens 2 and chip or wafer 4. Thus, the spatial light modulator, micro-mirror array 1, modulates the direction of reflected light (6 and 7) so as to define a predetermined light image 8 projected onto the chip or wafer 4. The direction of the reflected light alters the light intensity transmitted from each pixel to each feature. In essence, the spatial light modulator operates as a directional and intensity modulator.

The micro-mirror array 1 can be provided by, for example, the micro-mirror array of the Texas Instruments(TI) DMD, in particular, the TI "SVGA DLP™" subsystem. The Texas Instruments "SVGA DLP™" subsystem with optics may be modified for use in the present invention. The Texas Instruments "SVGA DLP™" subsystem includes a micro-mirror array (shown as micro-mirror array 1 in FIG. 1), a light source, a color filter wheel, a projection lens, and electronics for driving the array and interfacing to a computer. The color filter wheel is replaced with a bandpass filter having, for example, a bandpass wavelength of 365–410 nm (wavelength dependent upon the type of photochemicals selected for used in the process). For additional brightness at wavelengths of, for example, 400–410 mn, the light source can be replaced with arc lamp 3 and appropriate homogenizing and collimating optics. The lens included with the device is intended for use at very large conjugate ratios and is replaced with lens 2 or set of lenses appropriate for imaging the micro-mirror array 1 onto chip or wafer 4 with the desired magnification. Selection of the appropriate lens and bandpass filter is dependent on, among other things, the requisite image size to be formed on the chip, the type of spatial light modulator, the type of light source, and the type of photoresist and photochemicals being used in the system and process.

A symmetric lens system (e.g., lenses arranged by type A-B-C-C-B-A) used at 1:1 magnification (object size is the same as the image size) is desirable because certain aberrations (distortion, lateral color, coma) are minimized by symmetry. Further, a symmetric lens system results in a relatively simple lens design because there are only half as many variables as in an asymmetric system having the same number of surfaces. However, at magnification the likely maximum possible chip size is 10.88 mm×8.16 mm with a VGA device, or 10.2 mm×13.6 mm with an SVGA device. Synthesis of, for example, a standard GeneChip®12.8 mm×12.8 mm chip uses an asymmetric optical system (e.g., a magnification of about 1.25:1 with SVGA device) or a larger micro-mirror array (e.g., 1028×768 mirrors) if the mirror size is constant. In essence, the lens magnification can be greater than or less than I depending on the desired size of the chip.

In certain applications of the invention, a relatively simple lens system, such as a back-to-back pair of achromats or camera lens, is adequate. A particularly useful lens for some applications of the invention is the Rodenstock (Rockford, Ill.) Apo-Rodagon D. This lens is optimized for 1:1 imaging and gives good performance at magnifications up to about 1.3:1. Similar lenses may be available from other manufacturers. With such lenses, either the Airy disk diameter or the blur circle diameter will be rather large (maybe 10 μm or larger). See *Modern Optical Engineering,* 2d Edition, Smith, W. J., ed., McGraw-Hill, Inc., New York (1990). For higher-quality synthesis, the feature size is several times larger than the Airy disk or blur circle. Therefore, a custom-made lens with resolution of about 1–2 μm over a 12.8 mm×12.8 mm field is particularly desirable.

A preferred embodiment of synthesizing polymer arrays with a programmable micro-mirror array using the DMT process with photoresist takes place as follows. First, a computer file is generated and specifies, for each photolithography step, which mirrors in the micro-mirror array 1 need to be on and which need to be off to generate a particular predetermined image pattern. Next, the individual chip or the wafer from which it is made 4 is coated with photoresist on the synthesis surface and is mounted in a holder or flow cell (not shown) on the photolithography apparatus so that the synthesis surface is in the plane where the image of the micro-mirror array I will be formed. The photoresist may be either positive or negative thus allowing deprotection at locations exposed to the light or deprotection at locations not exposed to the light, respectively (example photoresists include: negative tone SU-8 epoxy resin (Shell Chemical) and those shown in the above cited patents and U.S. Pat. No. 5,959,098). A mechanism for aligning and focusing the chip or wafer is provided, such as a x-y translation stage. Then, the micro-mirror array 1 is programmed for the appropriate configuration according to the desired predetermined image pattern, a shutter in the arc lamp 3 is opened, the chip or wafer 4 is illuminated for the desired amount of time, and the shutter is closed. If a wafer (rather than a chip) is being synthesized; a stepping-motor-driven translation stage moves the wafer by a distance equal to the desired center-to-center center distance between chips and the shutter of the arc lamp 3 is opened and closed again, these two steps being repeated until each chip of the wafer has been exposed.

Next, the photoresist is developed and etched. Exposure of the wafer 4 to acid then cleaves the DMT protecting groups from regions of the wafer where the photoresist has been removed. The remaining photoresist is then stripped. Then DMT-protected nucleotides containing the desired base (adenine (A), cytosine (C), guanine (G), or thymine (T)) are coupled to the deprotected oligonucleotides.

Subsequently, the chip or wafer 4 is re-coated with photoresist. The steps for mounting the photoresist coated chip or wafer 4 in a holder through re-coating the chip or wafer 4 with photoresist are repeated until the polymer array synthesis is complete. It is worth noting that if a DPD method, using for example 1-(6-nitro-1,3-benzodioxol-5-yl) ethyloxycarbonyl (MeNPOC) chemistry, or a PAG method, using a polymer film containing a photoacid generator (PAG), are used for polymer array synthesis then photoresist would not be used and the process is somewhat simplified. However, the use of a direct write optical lithography system with a spatial light modulator is also applicable to performing a process of deprotection of reaction sites using the DPD and PAG methods without photoresist.

As is clear from the above described method for polymer array synthesis, no photomasks are needed. This simplifies the process by eliminating processing time associated with changing masks in the optical lithography system and reduces the manufacturing cost for polymer array synthesis by eliminating the cost of the masks as well as processing defects associated with using masks. In addition, the process has improved flexibility because reprogramming the optical lithography system to produce a different generate and verify new photomasks, thus making it possible to transfer an image pattern computer file directly from a CAD or similar system to the optical lithography system or providing electronic signals directly from the CAD system to drive the optical lithography system's means for dynamically producing the desired light pattern (e.g., spatial light modulator). Therefore, the optical lithography system is simplified and more efficient than conventional photomask based optical lithography systems. This is particularly valuable in complex multiple step photolithography processing; for example polymer array synthesis of GeneChip® probe arrays having upwards of seventy or more cycles, especially when many different products are made and revised.

As indicated above, substrates coated with photoresist are employed in preferred embodiments of the invention, e.g., using the DMT process with photoresist. The use of photoresist with photolithographic methods for fabricating polymer arrays is discussed in McGall et al., *Chemtech,* pp. 22–32 (February 1997); McGall et al., *Proc. Natl. Acad. Sci., U.S.A.,* Vol. 93, pp. 13555–13560 (November 1996) and various patents cited above, all of which are incorporated by reference in their entireties. Alternatively, polymer array synthesis processing can be performed using photoacid generators without using a conventional photoresist, e.g., using the PAG process, or using direct photodeprotection without using any photoresist, e.g., using the DPD process. The use of photoacid generators is taught in U.S. Pat. No. 6,083,697. However, the present invention is particularly useful when using the DMT and PAG processes for polymer array synthesis.

When synthesizing nucleic acid arrays, the photochemical processes used to fabricate the arrays is preferably activated with light having a wavelength greater than 365 nm to avoid photochemical degradation of the polynucleotides used to create the polymer arrays. Other wavelengths may be desirable for other probes. Many photoacid generators (PAGs) based on o-nitrobenzyl chemistry are useful at 365 nm. Further, when using the mirror array from Texas Instruments discussed above, the PAG is preferably sensitive above 400 nm to avoid damage to the mirror array. To achieve this, p-nitrobenzyl esters can be used in conjunction with a photosensitizer. For example,p-nitrobenzyltosylate and 2-ethyl-9,10-dimethoxy-anthracene can be used to photochemically generate toluenesulfonic acid at 405 nm. See S. C. Busman and J. E. Trend, *J Imag Technol.,* 1985, 11, 191; A. Nishida, T. Hamada, and O. Yonernitsu, *J Org. Chem.,* 1988, 53, 3386. In this system, the sensitizer absorbs the light and then transfers the energy to the p-nitrobenzyltosylate, causing dissociation and the subsequent release of toluensulfonic acid. Alternate sensitizers, such as pyrene, N,N-dimethylnapthylamine, perylene, phenothiazine, canthone, thiocanthone, actophenone, and benzophenone that absorb light at other wavelengths are also useful.

A variety of photoresists sensitive to 436-mn light are available for use in polymer array synthesis and will avoid photochemical degradation of the polynucleotides.

A second preferred mechanical modulator that may be used in the invention is the Grating Light Valve™ (GLV™) available from Silicon LightMachines, Sunnyvale, Calif., USA. The GLV™ relies on micromachined pixels that can be programmed to be either reflective or diffractive (Grating Light Valve™ technology). Information regarding certain of the mechanical modulators discussed herein is obtained at http://www.ti.com (Texas instruments) and http://siliconlight.com. (Silicon LightMachines).

Although preferred spatial light modulators include the mechanical modulators DMD™ available from Texas Instruments and the GLV™ available from Silicon LightMachines, various types of spatial light modulators exist and may be used in the practice of the present invention. See *Electronic Engineers' Handbook*, $3^{rd}$ Ed., Fink, D. G. and Christiansen, D. Eds., McGraw-Hill Book Co., New York (1989). Deformable membrane mirror arrays are available from Optron Systems Inc. (Bedford, Mass.). Liquid-crystal spatial light modulators are available from Hamamatsu (Bridgewater, N.J.), Spatialight (Novato, Calif.), and other companies. However, one skilled in the art must be careful to select the proper light source and processing chemistries to ensure that the liquid-crystal spatial light modulator is not damaged since these devices may be susceptible to damage by various ultraviolet (UV) light. Liquid-crystal displays (LCD; e.g., in calculators and notebook computers) are also spatial light modulators useful for photolithography particularly to synthesize large features. However, reduction optics would be required to synthesize smaller features using LCDs.

Some spatial light modulators may be better suited than the Texas Instruments device for use with UV light and would therefore be compatible with a wider range of photoresist chemistries. One skilled in the art will choose the spatial modulator that is compatible with the chosen wavelength of illumination and synthesis chemistries employed. For example, the device from Texas Instruments DMD™ should not be used with UV illumination because its micro-mirror array may be damaged by UV light. However, if the passivation layer of the micro-mirror array is modified or removed, the Texas Instruments DMD™ could be used in the invention with UV light.

Figure 2:
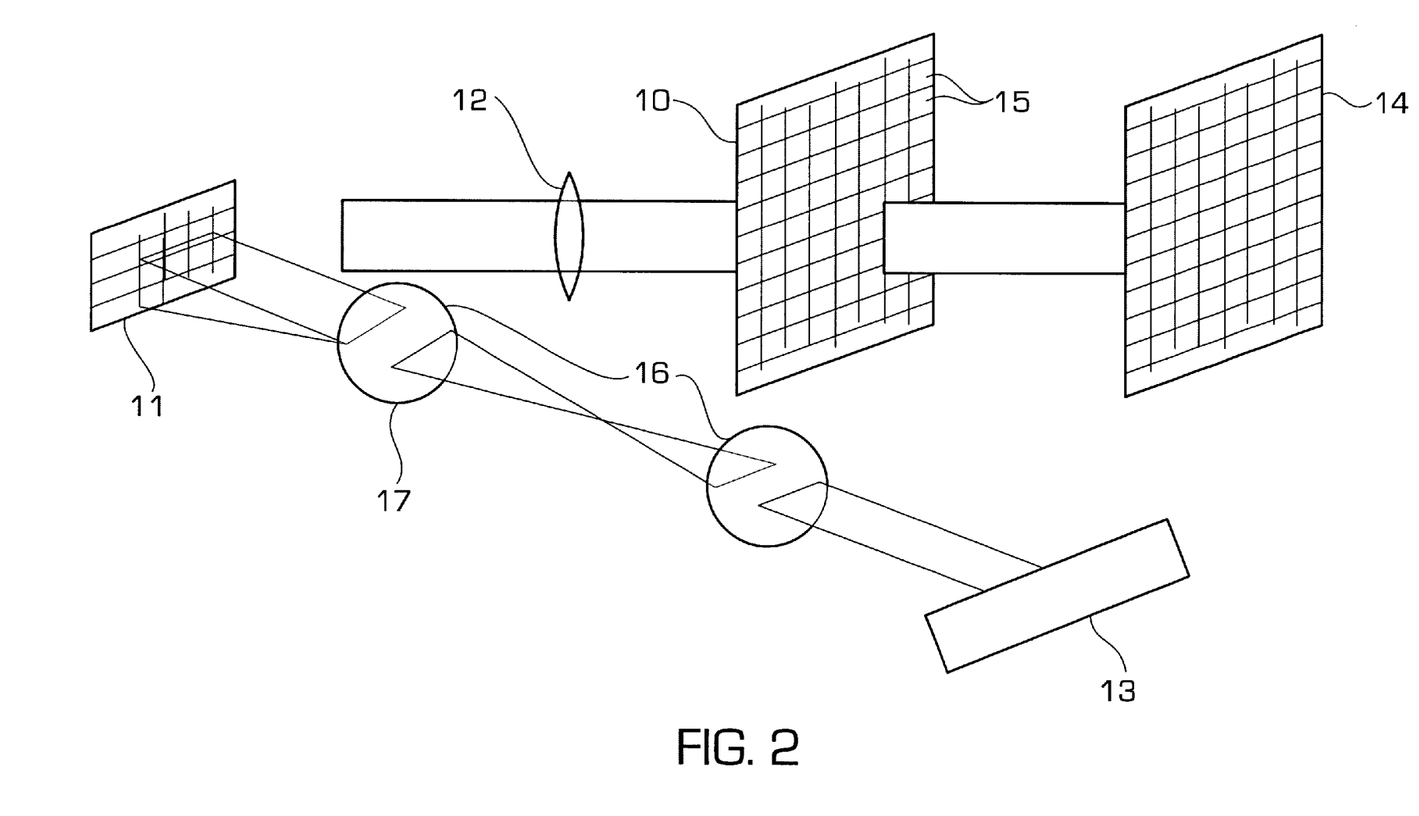
FIG. 2 is a diagrammatic representation of a second embodiment of the invention employing an array of, for example, micro-lenses.

One embodiment that is particularly useful when extremely high resolution is required involves imaging the micro-mirror array using a system of the type shown in FIG. 2. In this system, a lens 12 images the micro-mirror array 11 (e.g., DMD™ or GLV™) onto an array 10 having an array of micro-lenses 15 or non-imaging light concentrators. Each element of the array 10 focuses light onto the chip or wafer, e.g., Gene Chip array 14. Each micro-lens 15 produces an image of one pixel of the micro-mirror array 11. Optics 16, including a shaping lens 17 may be included to translate light from a light source 13 onto the micro-mirror array 11.

For example, if an SVGA DLP™ device is imaged with 1:1 magnification onto a micro-lens array 10, an appropriate micro-lens array 10 can consist of 800×600 lenses (micro-lenses 15) with 17 $\mu$m center-to-center spacing. Alternatively, the micro-lens array can consist of 400×300 17 $\mu$m diameter lenses with 34 $\mu$m center-to-center spacing, and with opaque material (e.g., chrome) between micro-lenses 15. One advantage of this alternative is that cross-talk between pixels is reduced. The light incident upon each micro-lens 15 can be focused to a spot size of 1–2 $\mu$m. Because the spot size is much less than the spacing between micro-lenses, a 2-axis translation stage (having, in these examples, a range of travel of at least either 17 $\mu$m×17 $\mu$m or 34 $\mu$m×34 $\mu$m) is necessary if complete coverage of the chip or wafer 14 is desired.

Figure 3:
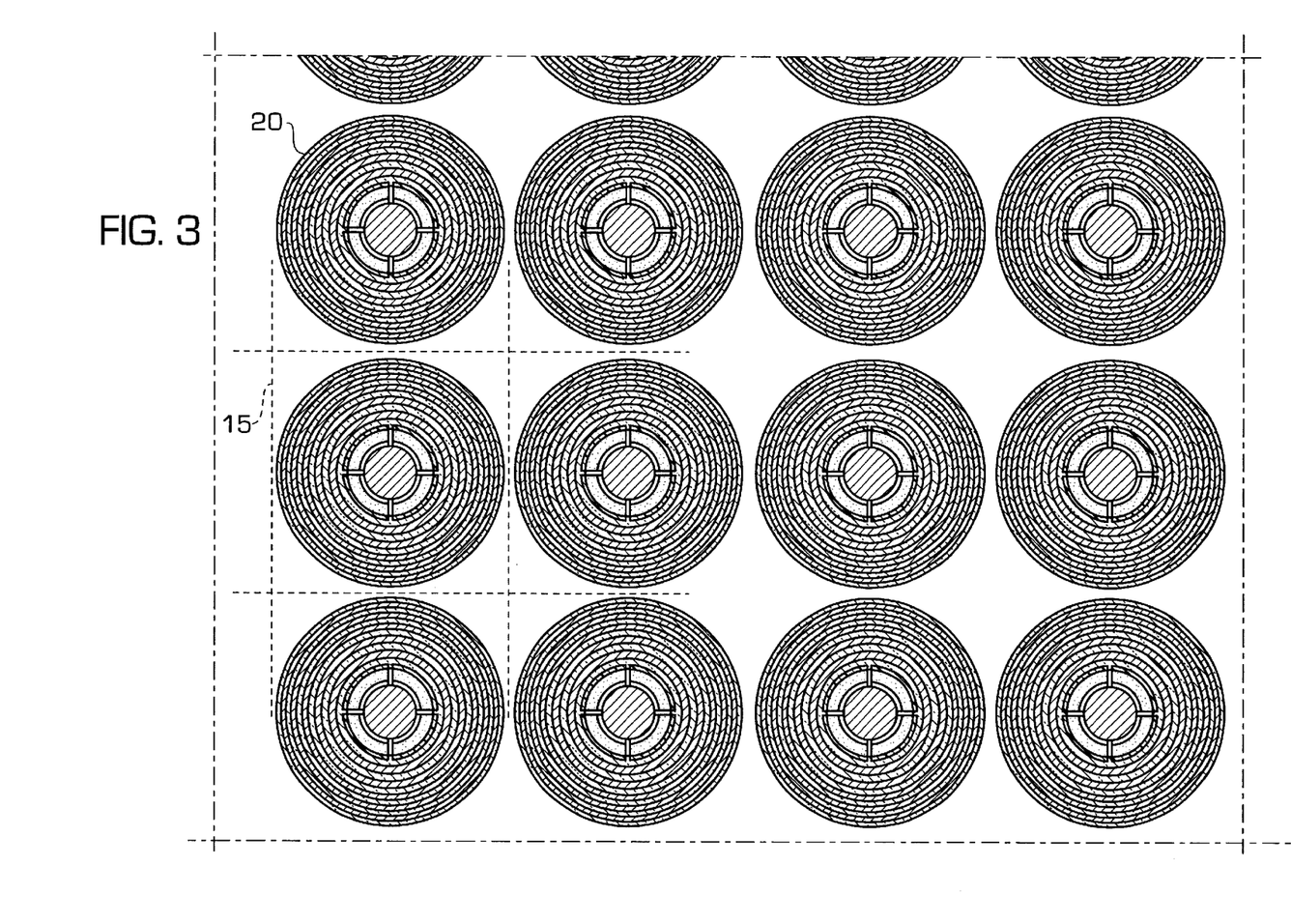
FIG. 3 illustrates a micro-lens array in the form of Fresnel Zone Plates, which may be used in the invention.

Micro-lenses 15 can be diffractive, refractive, or hybrid (diffractive and refractive). Refractive micro-lenses can be conventional or gradient-index. A portion of a diffractive micro-lens array 10 is shown in FIG. 3 and has individual micro-lenses formed as circles commonly known as Fresnel Zone Plates 20. Alternatively an array of non-imaging light concentrators can be employed. An example of such an approach would include a short piece of optical fiber which may be tapered to a small tip.

Furthermore, some spatial light modulators are designed to modulate transmitted rather than reflected light. An example of a transmissive spatial light modulator is a liquid crystal display (LCD) and is illustrated in another embodiment, shown in FIG. 4. This embodiment includes a light source 33 providing light 35, transmissive spatial light modulator 31 and a computer 39 providing electronic control signals to the transmissive spatial light modulator 31 through cables 40 so as to transmit a desired light image 38 on the chip or wafer 34. The computer 39 may be, for example, a unique programmable controller, a personal computer (PC), or a CAD system used to design the desired image pattern.

Using a transmissive spatial light modulator has even additional advantages over the conventional optical lithography system. Reflective spatial light modulators require a large working distance between the modulator and the lens so that the lens does not block the incident light. Designing a high performance lens with a large working distance is more difficult than designing a lens of equivalent performance with no constraints on the working distance. With a transmissive spatial light modulator the working distance does not have to be long and lens design is therefore easier. In fact, as show in FIG. 4, some transmissive spatial light modulators 31 might be useful for proximity or contact printing with no lens at all, by locating the modulator very close to the chip or wafer 34.

Figure 4:
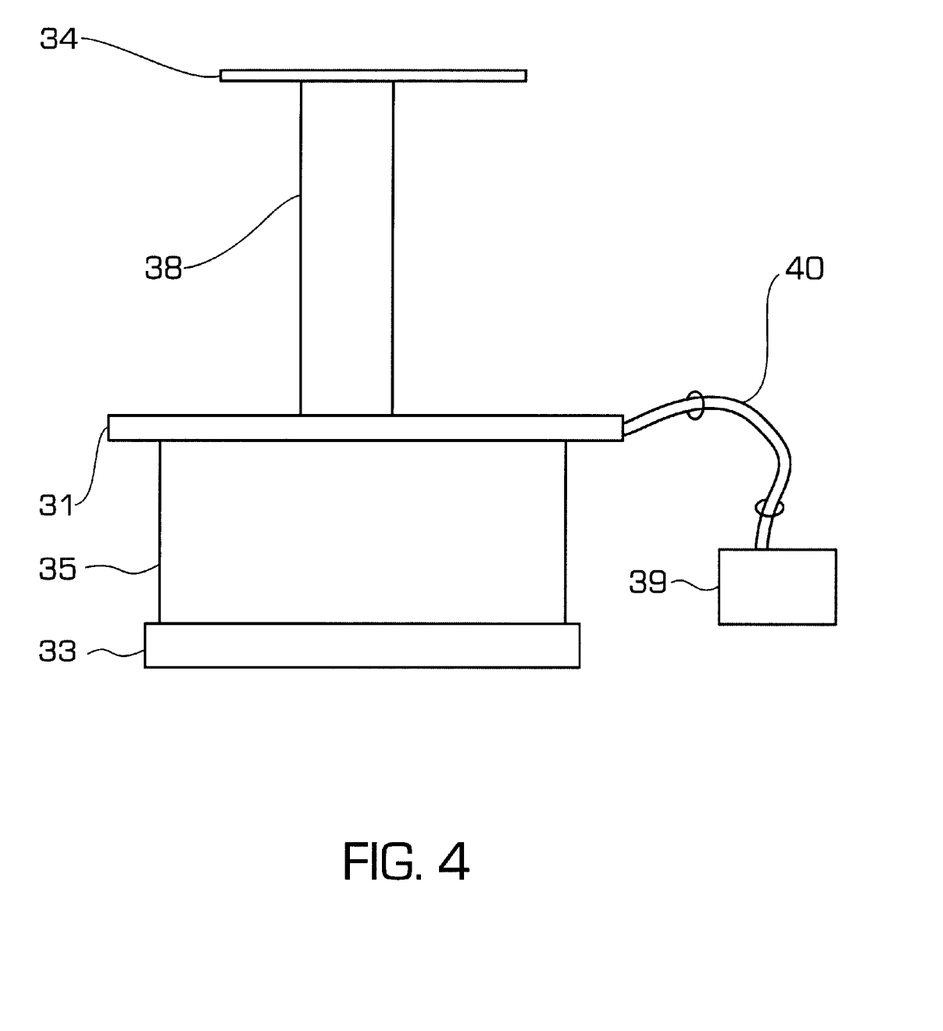
FIG. 4 shows a third embodiment of the invention having a transmissive spatial light modulator.

In fact, the transmissive spatial light modulator in the embodiment of FIG. 4 could be replaced by an LED array or a semiconductor laser arrays emitting light of the appropriate wavelength, each of which not only may be operated to dynamically define a desired image but also act as the light source. Thus, as modified, this embodiment would be simplified so as to not require a separate light source.

Although discussed herein in reference to polymer array synthesis, one skilled in the art will appreciate that the present invention has a variety of applications including, among others, silicon micromachining and custom semiconductor chip manufacturing. However, use of some types of spatial light modulators with the invention may result in limiting the types of geometries available in silicon micromachining and custom semiconductor chip manufacturing applications. It is understood that the examples and embodiments described herein are for illustrative purposes only and that various modifications or changes in light thereof will be suggested to persons skilled in the art and are to be included within the spirit and purview of this application and scope of the appended claims.

All publications, patents, and patent applications cited herein are hereby incorporated by reference in their entirety for all purposes. U.S. Pat. No. 6,136,269 relates to the present invention and is hereby incorporated by reference for all purposes.

What is claimed is:

1. A method for deprotecting reaction sites on a substrate comprising the steps of:

provide a substrate having protected reaction sites;

modulating light direction with a spatial light modulator so as to generate a predetermined light pattern used for deprotecting selected portions of said protected reaction sites.

2. The method of claim 1, further comprising the step of directing light from a light source to said spatial light modulator.

3. The method of claim 2, further comprising the step of projecting said predetermined light pattern onto a surface of said substrate with a lens.

4. The method of claim 3, further comprising the step of transmitting said predetermined light pattern from said lens through a micro-lens array.

5. The method of claim 4, further comprising the step of moving said substrate with a translation stage.

6. The method of claim 4, wherein said spatial light modulator is a SVGA DLP™.

7. The method of claim 2, further comprising the step of transmitting said predetermined light pattern through an array of non-imaging light concentrators.

8. The method of claim 2, wherein said spatial light modulator is a micro-mirror array.

9. The method of claim 8, wherein said spatial light modulator is a DMD™.

10. The method of claim 2, wherein said spatial light modulator is a GLV™.

11. The method of claim 1, further comprising the step of generating a computer file that specifies, for each photolithography step, which portions of said spatial light modulator will operatively illuminate which portions of said protected reaction sites.

12. The method of claim 11, further comprising the step of programming said spatial light modulator to a desired configuration with information contained in said computer file.

13. A method of deprotecting reaction sites on a substrate comprising:

providing a substrate having protected reaction sites;

providing a light source;

providing a spatial light modulator;

orienting said substrate, said light source, and said spatial light modulator such that when said light source illuminates, intensity of illumination from said light source is modulated by said spatial light modulator and generates a predetermined light image pattern; and illuminating said substrate with said predetermined light image pattern at said substrate so as to deprotect at least one of said protected reaction sites.

14. The method of claim 13, further comprising the step of projecting said predetermined light pattern onto a surface of said substrate with a lens.

15. The method of claim 14, further comprising the step of transmitting said predetermined light pattern from said lens through a micro-lens array.

16. The method of claim 15, further comprising the step of moving said substrate with a translation stage.

17. The method of claim 15, wherein said spatial light modulator is a SVGA DLP™.

18. The method of claim 13, further comprising the step of transmitting said predetermined light pattern through an array of non-imaging light concentrators.

19. The method of claim 13, wherein said spatial light modulator is a micro-mirror array.

20. The method of claim 19, wherein said spatial light modulator is a DMD™.

21. The method of claim 13, wherein said spatial light modulator is a GLV™.

22. The method of claim 13, further comprising the step of generating a computer file that specifies, for each photolithography step, which portions of said spatial light modulator will operatively illuminate which portions of said protected reaction sites.

23. The method of claim 22, further comprising the step of programming said spatial light modulator to a desired configuration with information contained in said computer file.

* * * * *

UNITED STATES PATENT AND TRADEMARK OFFICE
CERTIFICATE OF CORRECTION

PATENT NO. : 6,271,957 B1 Page 1 of 1
APPLICATION NO. : 09/318775
DATED : August 7, 2001
INVENTOR(S) : Calvin F. Quate et al.

It is certified that error appears in the above-identified patent and that said Letters Patent is hereby corrected as shown below:

On the Title page of the printed patent, paragraph [75] Inventors, lines 1-2, "Calvin F. Quate, Stanford; David Stern, Mountain View, both of CA (US)" should be "Calvin F. Quate, Stanford, CA (US)".

Signed and Sealed this

Second Day of December, 2008

JON W. DUDAS
*Director of the United States Patent and Trademark Office*

(12) EX PARTE REEXAMINATION CERTIFICATE (6947th)
United States Patent
Quate (10) Number: US 6,271,957 C1
(45) Certificate Issued: Jul. 21, 2009

(54) METHODS INVOLVING DIRECT WRITE OPTICAL LITHOGRAPHY

(75) Inventor: Calvin F. Quate, Stanford, CA (US)

(73) Assignee: Affymetrix, Inc., Santa Clara, CA (US)

Reexamination Request:
No. 90/008,708, Jul. 25, 2007

Reexamination Certificate for:
Patent No.: 6,271,957
Issued: Aug. 7, 2001
Appl. No.: 09/318,775
Filed: May 26, 1999

Certificate of Correction issued Dec. 2, 2008.

Related U.S. Application Data

(60) Provisional application No. 60/087,333, filed on May 29, 1998.

(51) Int. Cl.
*B01J 19/00* (2006.01)
*G03F 7/20* (2006.01)

(52) U.S. Cl. .................... 359/298; 359/223.1; 359/293; 359/619; 422/50; 430/312; 436/518; 536/25.3

(58) Field of Classification Search .................. None
See application file for complete search history.

(56) References Cited

U.S. PATENT DOCUMENTS

| | | | | |
|---|---|---|---|---|
| 5,045,431 | A | * | 9/1991 | Allen et al. ............... 430/270.1 |
| 5,143,854 | A | | 9/1992 | Pirrung ....................... 436/518 |
| 5,212,046 | A | * | 5/1993 | Lamola et al. ........... 430/270.1 |
| 5,230,984 | A | * | 7/1993 | Tachiki et al. ............ 430/270.1 |
| 5,604,624 | A | | 2/1997 | Magarill ..................... 359/224 |
| 5,870,176 | A | | 2/1999 | Sweatt ......................... 355/53 |
| 5,959,098 | A | | 9/1999 | Goldberg ................... 536/25.3 |
| 6,040,193 | A | | 3/2000 | Winkler ....................... 506/16 |
| 6,060,224 | A | | 5/2000 | Sweatt ......................... 430/395 |
| 6,083,697 | A | | 7/2000 | Beecher ......................... 435/6 |
| 6,375,903 | B1 | | 4/2002 | Cerrina ....................... 422/131 |
| 6,426,184 | B1 | | 7/2002 | Gao ................................ 435/6 |

OTHER PUBLICATIONS

105,446 Younse; "Projection Display Systems Based on the Digital Micromirror Device™ (DMD™)," SPIE, vol. 2641, pp. 64–75, Sep. 13,1995.
105,446 Bloom; "The Grating Light Valve: revolutionizing display technology," SPIE, vol. 3013, pp. 165–171, May 8, 1997.
105,446 Hornbeck; "Digital Light Processing™ and MEMS: Reflecting the digital display needs of the networked society," SPIE, vol. 2783, pp. 2–13, Aug. 26, 1996.
105,446 Hsieh; "Reflective masks for 1X deep ultraviolet lithography," SPIE, vol. 1604, pp. 67–77, Jan. 1, 1992.
Gao; "Oligonucleotide Synthesis Using Solution Photogenerated Acids," JACS, vol. 120, pp. 12698–12699 (1998).
Motamedi; "Micro–opto–electro–mechanical devices and on–chip optical processing," Opt. Eng. 36(5) pp. 1282–1297 (1997).

* cited by examiner

*Primary Examiner*—Lynne H Browne (57) ABSTRACT

An improved optical photolithography system and method provides predetermined light patterns generated by a direct write system without the use of photomasks. The Direct Write System provides predetermined light patterns projected on the surface of a substrate (e.g., a wafer) by using a computer controlled component for dynamically generating the predetermined light pattern, e.g., a spatial light modulator. Image patterns are store in computer and through electronic control of the spatial light modulator directly illuminate the wafer to define a portion of the polymer array, rather than being defined by a pattern on a photomask. Thus, in the Direct Write System each pixel is illuminated with an optical beam of suitable intensity and the imaging (printing) of an individual feature is determined by computer control of the spatial light modulator at each photolithographic step without the use of a photomask. The Direct Write System including a spatial light modulator is particularly useful in the synthesis of DNA arrays and provides an efficient element for polymer array synthesis by using spatial light modulators to generate a predetermined light pattern that defines the image patterns of a polymer array to be deprotected.

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1–37 are cancelled.

* * * * *